United States Patent [19]

White

[11] Patent Number: 4,724,496
[45] Date of Patent: Feb. 9, 1988

[54] PEAK DETECTOR FOR MAGNETICALLY RECORDED BINARY SIGNAL

[76] Inventor: R. Kent White, 420 Kisconko Turn, Ft. Washington, Md. 20744

[21] Appl. No.: 4,283

[22] Filed: Jan. 6, 1987

Related U.S. Application Data

[63] Continuation of Ser. No. 790,887, Oct. 24, 1985, abandoned.

[51] Int. Cl.$^4$ ............ G11B 5/09; G11B 5/03; G11B 5/02
[52] U.S. Cl. ............................ 360/46; 360/66; 360/67
[58] Field of Search .................................... 328/147

[56] References Cited

U.S. PATENT DOCUMENTS

| | | | |
|---|---|---|---|
| 3,500,073 | 3/1970 | Soleman | 307/268 |
| 3,524,075 | 8/1970 | Matthews et al. | 307/235 |
| 3,566,281 | 2/1971 | Baumann | 328/171 |
| 3,763,436 | 10/1973 | Haw | 328/147 |
| 4,385,328 | 5/1983 | Tanaka | 360/46 |
| 4,528,601 | 7/1985 | Moriyama et al. | 360/46 |

Primary Examiner—Vincent P. Canney
Attorney, Agent, or Firm—Boris Haskell

[57] ABSTRACT

A magnetically recorded representation of an electrical binary waveform is transduced to an electrical signal wherein the binary waveform transitions are represented by peaks in the electrical signal. A delayed replica of the transduced signal is formed, and at least one of the transduced signal and replica signal is dynamically biased. These two signals are then compared to detect relative polarity reversals therebetween and to generate a binary waveform whose transitions correspond to said reversals and is therefore a replica of the magnetically recorded binary waveform.

27 Claims, 13 Drawing Figures

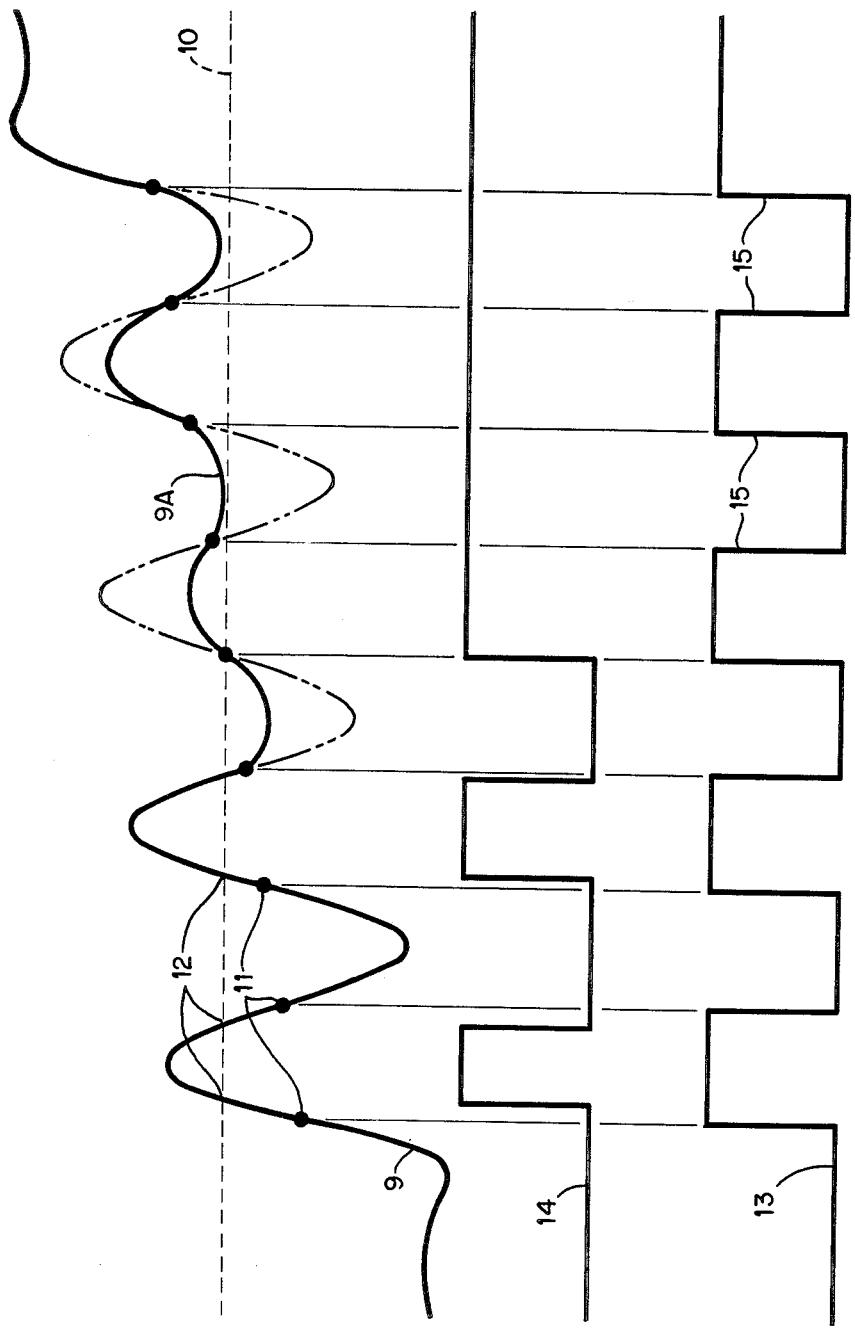

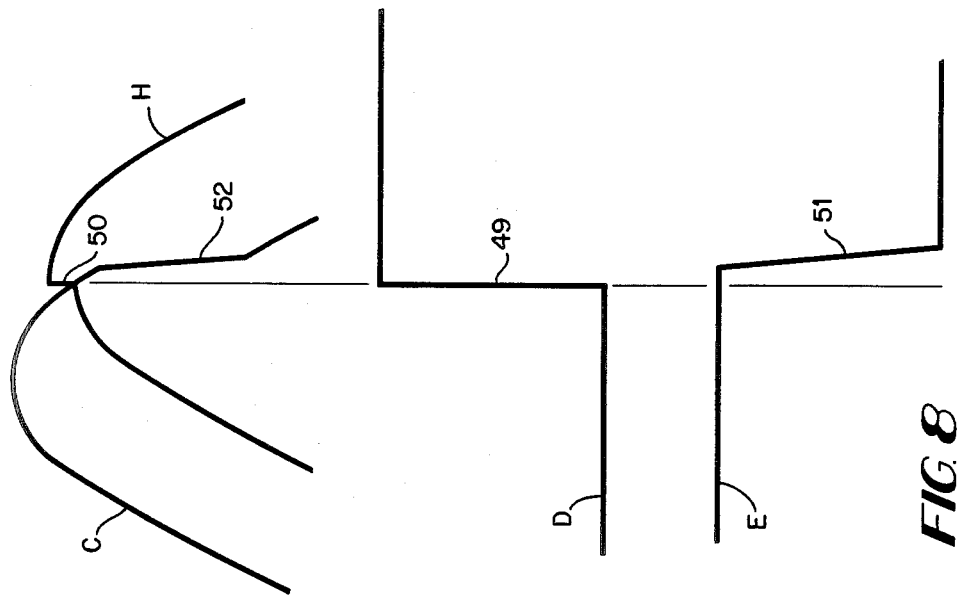
FIG. 8
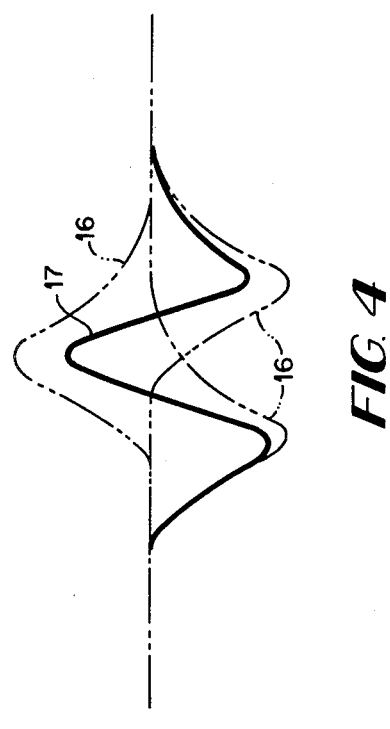
FIG. 4
FIG. 5

PEAK DETECTOR FOR MAGNETICALLY RECORDED BINARY SIGNAL

This application is a continuation of application Ser. No. 790,887 filed Oct. 24, 1985 now abandoned.

INTRODUCTION AND SUMMARY OF THE INVENTION

The present invention relates to reading magnetically recorded signals. More particularly, the invention as described herein relates to the reproduction of magnetically recorded data signals with accurate time relationships for the reproduced data signal bit transitions. For purpose of illustration, the invention is described in relation to a non-return to zero (NRZ) digital data signal. It is also described in relation to the processing of signals as obtained from a conventional and well known ring type induction head, transducing or reading from a magnetic medium having planar (plane of medium motion) magnetocrystalline or acicular particle orientation. However, the invention is not limited to that data signal format, or to that particular record and read system.

In the stated record and read system, and in the case of an NRZ original data signal, the waveform obtained from the read head is a first order differentiation of the original data signal, in which the peaks correspond to the transitions between binary levels. This relationship is illustrated in FIG. 1, wherein waveform 1 depicts the recorded data signal, and waveform 2 represents the read head output signal representative thereof. Pursuant to the present invention, the original data signal binary transitions are reproduced or replicated in accurate time relationship from the read signal peaks, and their reproduction is accomplished more accurately and more efficiently than in the prior art.

Detection or reproduction of the original data signals from a planar flux compatible signal such as illustrated by waveform 2, is generalized and idealized in FIG. 2. It is common practice either to amplitude equalize, i.e. primarily integrate the signal, or to differentiate the signal, thereby, in either case, converting peak points of the read waveform 2 to points of inflection or zero crossings. Phase equalization is also used in conjunction with amplitude equalization. In FIG. 2, a waveform 3 is obtained by amplitude equalization of the read signal 2, and a waveform 4 is obtained by differentiation of the read signal 2. The dotted line 5 through the amplitude equalized waveform 3 shows the detection threshold, e.g. zero volts. The dual lines 6 and 7 through the differentiated waveform 4 show detection threshold hysteresis used to avoid false detection of data at baseline or near zero volts, and to provide noise immunity. The upper dotted line 6 is the threshold for positive going signals; the lower dotted line 7 is the threshold for negative going signals. Some hysteresis may also be used in conjunctin with amplitude equalized signals. Detected or reproduced data waveform 8 ultimately result from further processing of either signal 3 or 4. In order to reduce interference from random noise and signal level transients, data level detection can be accomplished by comparing brief duration amplitude samples of a fully equalized read signal with a predetermined slicing level. The amplitude samples are taken at mid-bit intervals and are synchronous with a clock derived from a separate data transition detector.

A primary objective of any data detection scheme is accurate detection of data transitions at the correct time, but several error mechanisms obstruct this objective.

The baseline of zero volt referenced read head signals, or their processed equivalents, varies dynamically from a true zero volt level by the integrated value with respect to time of the signal voltage. This occurs because of the absence of dc response of the record/reproduce channel. The magnitude of this "baseline gallop" is dependent upon data patterns and upon time constants of circuit elements functioning as integrators. FIG. 3 shows a processed read signal 9 the baseline of which is varying about a detection threshold indicated by the dashed line 10. The dots 11 on the signal waveform are the correct indicators of data transition points, however transitions are actually detected at signal/threshold level interceps 12. Accordingly, the proper data pattern is shown by waveform 13, but the actual detected waveform is shown at 14 and results from the baseline gallop error mechanism. There is a clear time displacement error of transitions in the actual detected waveform. If the instantaneous baseline departure from the threshold level is sufficient, then a simultaneous reduction in signal amplitude (dropout) 9A can cause a complete loss of transitions 15 from the correct data waveform 13. Such loss of transitions will not result from moderate dropouts if the baseline does not deviate from the threshold. Examples of methods employed in the current art to reduce baseline gallop are use of codes with low dc in their power spectra, complementary data sequence writing to maintain near zero values of the baseline integration, and the addition of dc restorer circuits, all of which, add considerable complexity to a basic detector.

In some systems, data is recorded over previously recorded data without benefit of an erase cycle. The result is overwrite interference which can produce peak and baseline amplitude displacements similar to those of baseline gallop.

Pulse crowding, the addition of closely spaced signal pulses in linear circuits, is another error mechanism of concern, which both reduces peak to peak amplitude and shifts peaks in amplitude with respect to the baseline, as is shown in FIG. 4. Three closely spaced pulses 16 of alternating sense, rendered in phantom, produce a "crowded" signal 17. Some time displacement of the peaks of a crowded signal can also occur.

FIG. 5 illustrates an ideal equalized read signal 18 shown in phantom with superposed noise peaks 19 and a detector threshold 20. The ideal signal intercepts the slicing level 20 at points 21, which would produce the correctly timed data transitions 22, shown in phantom, if noise were absent. However, because of the noise 19, the actual intercepts are time displaced as shown at 23, resulting in time displaced transitions 24. Noise has the potential for producing either time displacement errors, as shown in FIG. 5, or amplitude errors in the case of amplitude sampling detection, and thereby limits the bit reliability of any detection system. Noise power with respect to signal power at a read head preamplifier stage is minimum, and any subsequent element of a data detection system may inject or amplify noise. This is particularly true of elements which exhibit a high-pass characteristic such as differentiators. Differentiation using a delay line differentiator, or careful band limiting at various read stages, are examples of means which can be employed to reduce noise enhancement. Of course, the most desirable approach would be the avoidance of as much signal processing as possible.

Baseline gallop and dropouts displace the peaks of planar flux signals in amplitude, not in time. Subsequent processing elements such as amplitude equalizers and phase equalizers can convert amplitude displacements into time displacements, thereby increasing susceptability to these mechanisms. The criticality of record current levels can also be increased by processing other than amplification. Time displacement errors may act directly on data or indirectly on clock signals. In general, the greater the degree of transition timing error to be accommodated by a detection system, the longer will be the recovery time of clock or strobe signals following dropouts or transients. For example, in a phase-locked loop clock detection circuit, large random timing errors of the reference (data) signal with respect to the VCO (clock) signal must be averaged from the phase comparator by a loop filter having a long time constant, which, in turn, causes slow recovery of synchronized clock signals.

In accordance with the present invention, digital data transitions are detected directly from the amplified signal peaks obtained from the read head. As previously stated, this signal may be from an induction read head reproducing a planar flux magnetic recording. The detection is accomplished broadly, by producing a slightly delayed replica of the amplified read head signal, imposing a dynamic bias on one of the signals (e.g. a negative dc step on each negative going portion of the signal, and a positive dc step on each positive going portion), and determining when, in the region of the peaks of the signals, relative polarity of the two signals reverses. Also, one may impose dynamic biasing on both signals. Selection of the signal(s) and senses of biasing will be apparent from consideration of the subsequent description. The time relationship of the relative polarity reversals accurately represent the time relationship of the transitions of the original data signal between binary levels. Therefore, these relative polarity reversals enable an accurate replication of the data signal.

Because the data transitions detection is accomplished by comparing the peaks of the read signal and a delayed replica thereof, a dynamic virtual slicing level is provided that varies as required to compensate for changes in signal amplitude. Prior to data detection, uniform amplification through the desired passband, and delay, are the ony signal processing steps required. It will be appreciated that in a magnetic recorder digital data detection system, avoidance of signal processing other than low noise linear amplification, and delay, has the potential for a high degree of noise immunity. It will also be appreciated that such linear processing has little time displacement effect on signal peaks. It will be further appreciated that provision of a dynamic amplitude reference has the potential to compensate dropouts and other amplitude error mechanisms instantaneously.

It is, therefore, one object of the present invention to provide for accurately detecting and replicating magnetically recorded digital data.

Another object of the present invention is to provide for accurately detecting and replicating magnetically recorded digital data in a manner compatible with planar flux recordings and induction read heads.

Another object of the present invention is to provide for accurately detecting and replicating magneticlly recorded digital data, by comparing the read head signal with a delayed replica thereof, to determine the reversals in relative polarity of the peaks of these signals.

Another object of the present invention is to provide for accurately detecting and replicating magnetically recorded digital data in the manner stated above, wherein one of said signals is dynamically biased.

Still another object of the present invention is to provide for accurately detecting and replicating magnetically recorded digital data in the manner stated above, and having a high degree of immunity from noise and from signal amplitude variations.

Other objects and advantages of the present inventin will become apparent to those skilled in the art from a consideration of the following detailed description of the invention, including several illustrative specific embodiments.

BRIEF DESCRIPTION OF THE DRAWINGS

The present specification refers to and incorportes the accompanying drawings, in which like numerals refer to like or corresponding parts or representations, and wherein:

FIG. 3 presents a series of waveforms illustrating one type of error encountered in conventional processing of read head signals obtained from a magnetic recording of a binary data signal;

FIG. 4 presents waveforms illustrating another source of error encountered in conventional processing of such read head signals;

FIG. 5 presents waveforms illustrating still another source of error encountered in conventional processing of read head signals;

FIG. 8 is a waveform diagram of certain signal details applicable to the embodiment of FIG. 7;

DETAILED DESCRIPTION OF THE INVENTION

Figure 6C:
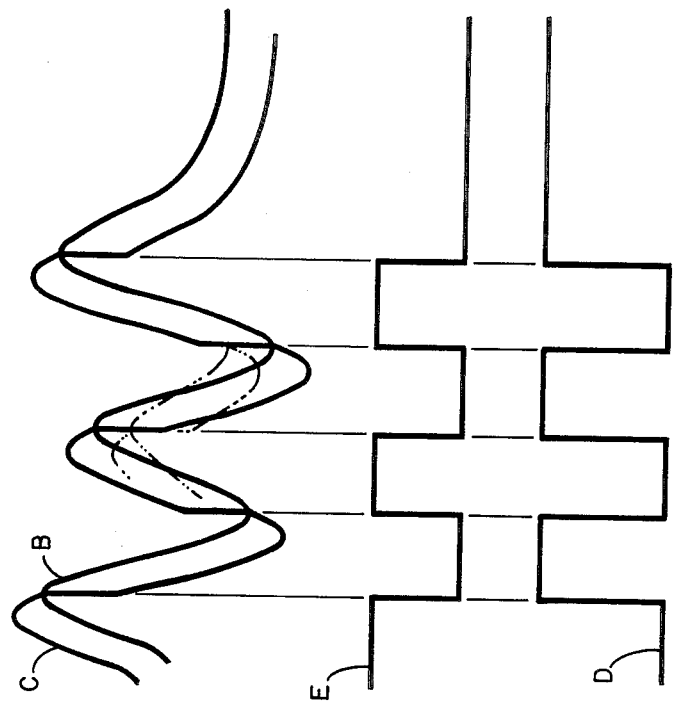
FIG. 6 presents sets of waveforms illustrating the relationship between a read head signal and a delayed replica thereof, when one signal has a higher gain than the other (6A), when one signal has a dc bias applied thereto (6B), and when one signal has a dynamic bias applied thereto (6C) in accordance with the present invention.
Figure 6A:
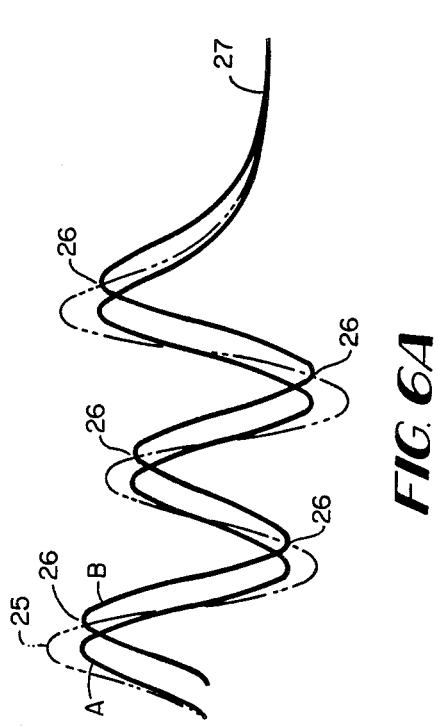

FIG. 6A illustrates a read signal waveform A with a delayed replica B; the waveform 25 shown in phantom is a gain adjusted variation of the read signal A. If the two signals having correct relative amplitudes (waveforms B and 25 as shown) are applied to a voltage comparator, transitions occur at the output of the comparator, which correspond to intercepts 26 in the region of the peaks where relative polarity of the two signals reverses. However, in the extended region 27, where the signals approach the baseline or zero volts, there is a condition of possible data ambiguity or false detection of relative polarity reversal.

Figure 6B:
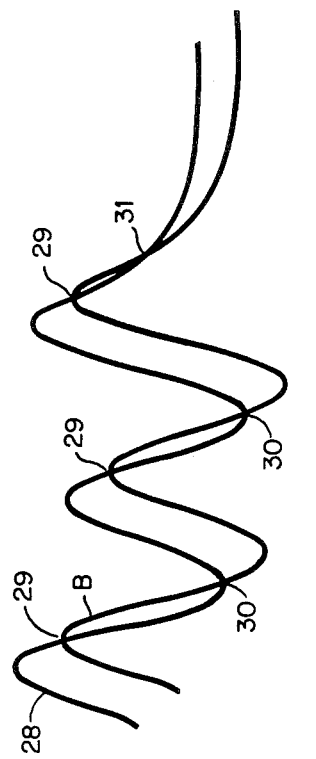

FIG. 6B illustrates a dc biased read waveform 28 with a delayed replica B. The baseline ambiguity of FIG. 6A is eliminated, however, correct detection point intercepts 29 are formed only at positive peaks. Negative peak intercepts 30 are time displaced, and one erroneous intercept 31 is formed where the signal descends to baseline.

In order to form intercepts at all peaks to be detected, to avoid baseline ambiguity, and to avoid erroneous intercepts, a dynamic alternate polarity bias signal is used. FIG. 6C illustrates such a dynamically biased read signal waveform C with a delayed replica B. Intercepts are formed correctly at all peaks, and the data waveform D detected thereby is illustrated. No baseline ambiguity exists and no erroneous intercepts are present. The dynamic bias waveform E is also shown; it is the complement to the data signal waveform D. The effect of a change in signal amplitude for this detection method is illustrated in phantom in FIG. 6C. A change in signal level produces a corresponding instantaneous change in the delayed replica. Peak intercepts still occur, as desired, at the same points in time, illustrating that this mechanism provides a high degree of amplitude error immunity.

Figure 7:
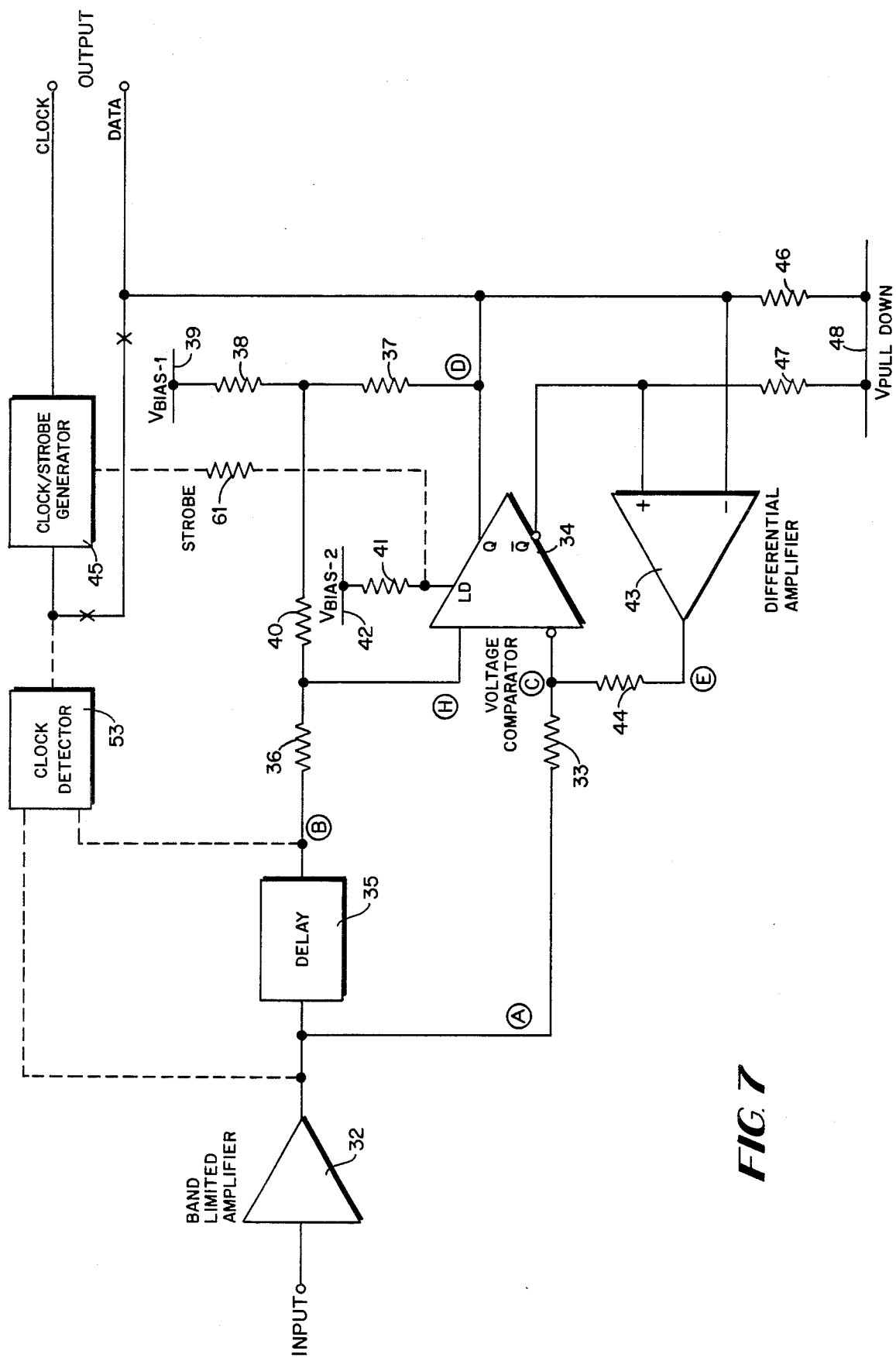
FIG. 7 is a circuit diagram of one embodiment of the present invention, and including within the diagram an alternate variation of the embodiment.

FIG. 7 diagrams in solid lines the essential elements of one embodiment of the present invention. The circled letters refer to waveforms present at the points of designation and correspond to like letters of FIGS. 6C and 8. A read head signal (zero biased) is applied to the input of amplifier 32 which is band limited to preclude interference from noise outside the signal passband. The output impedance of amplifier 32 is of a low value compared to mixing resistor 33 which couples the amplifier to the inverting input of voltage comparator 34. The gain of amplifier 32 should maintain normal signal levels lower than common mode input limits of comparator 34, while allowing reasonably low level input signals created by dropouts to be greater than the sensitivity of comparator 34. The output of amplifier 32 is also coupled to delay element 35 which may be a delay line or an RC network, either of which should be buffered for low output impedance, and gain compensated to nominally match amplifier 32, or be gain variable. The delay may be fixed with respect to a bit interval, e.g. an 8 microsecond delay for a 24 microsecond bit cell, or the delay may be variable. The output of delay element 35 is coupled by mixing resistor 36 to the non-inverting input of comparator 34. The Q output of comparator 34, which is the detected or replicated digital data output, is divided by resistors 37 and 38 connected to a bias voltage bus 39 of the correct polarity to allow a zero volt bias Thévenin equivalent to be formed at the junction of resistors 37 and 38, e.g. a positive voltage bus for a comparator having ECL compatible output(s). The zero biased signal at the junction of resistors 37 and 38 is coupled by isolation and limiting resistor 40 to input mixing resistor 36, thus providing a controlled amount of positive feedback (hysteresis) for comparator 34. This feedback assures rapid switching of the comparator 34 through its active region, even for the relatively slow rates of voltage change occurring at input signal peaks. Alternatively, for some commercial voltge comparators, hysteresis can be obtained by applying an active region dc bias to a latch disable input. In this first embodiment, the latch disable (LD) input of comparator 34 is biased high by resistor 41 connected to a bias bus 42 for non-latching operation.

The comparator 34 thus provides at its Q output the detected or replicated data signal D, and in addition, it provides at its $\bar{Q}$ output the complement of the detected data signal. These complementary outputs of comparator 34 are coupled to differential amplifier 43 inputs in a sense to produce its output inverted with respect to detected data; this output, in turn, is coupled to input mixing resistor 33 by limiting resistor 44. Thus, the required alternate polarity dynamic bias signal is provided for the comparator 34. The comparator outputs are also provided with required pulldown (or pullup) resistors 46 and 47 connected to an appropriate voltage supply bus 48. A single comparator output with an alternate amplifier configuration could, of course, produce the same dynamic bias signal. Also, a second voltage comparator could replace the function of amplifier 43. The gain of amplifier 43 may be fixed in conjunction with read signal levels to the comparator, or be variable. In either case, ideally adjusted delayed replica levels and dynamically baised input signal levels produce intercepts at all delayed replica peak points, as illustrated in FIG. 6C. The offset of these two signals must be sufficient to provide good noise immunity. The propagation delay of amplifier 43 should be long compared to that of the comparator/hysteresis network combination; this delays any change in dynamic bias until the comparator has switched through its active region, and prevents additional positive feedback which might create instability. It should be noted that this criterion is more permissive than restrictive. The data signal of this embodiment is coupled to a clock generator 45 for derivation of a clock signal to be used in subsequent data synchronization.

FIG. 8 shows waveform and timing details related to detection of a positive transition (peak) for this embodiment. A positive transition 49 of the data signal D from the comparator 34 results when the dynamically baised read signal C changes polarity with respect to the delayed replica and hysteresis signal H. The positive transition 49 of the data signal D and the hysteresis step 50 in waveform H are coincident. The bias signal E occurs later, as a result of amplifier 43 propagation delay; its negative transition 51 and the biased read signal step 52 are coincident as shown. The delayed occurrence of a bias signal transition assures that this change in signal merely re-references the comparator for subsequent detection of the next or opposite (negative) polarity peak without providing regenerative feedback energy. This, of course, relieves need for concern over loop reactance and gain.

Figure 1:
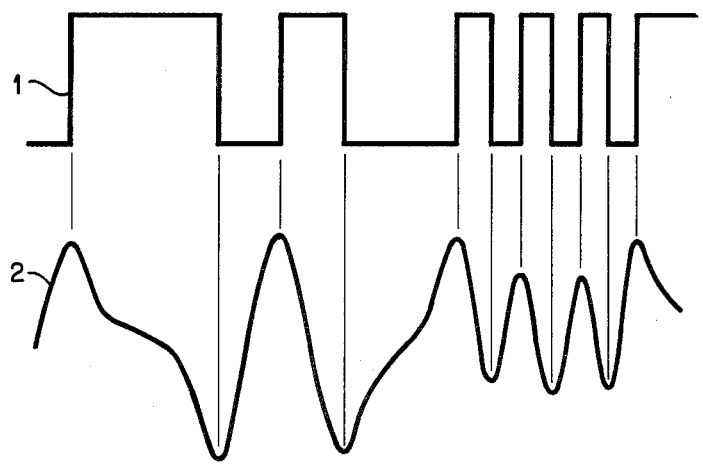
FIG. 1 illustrates an NRZ data signal and the read head generated signal obtained from a magnetic recording thereof.
Figure 2:
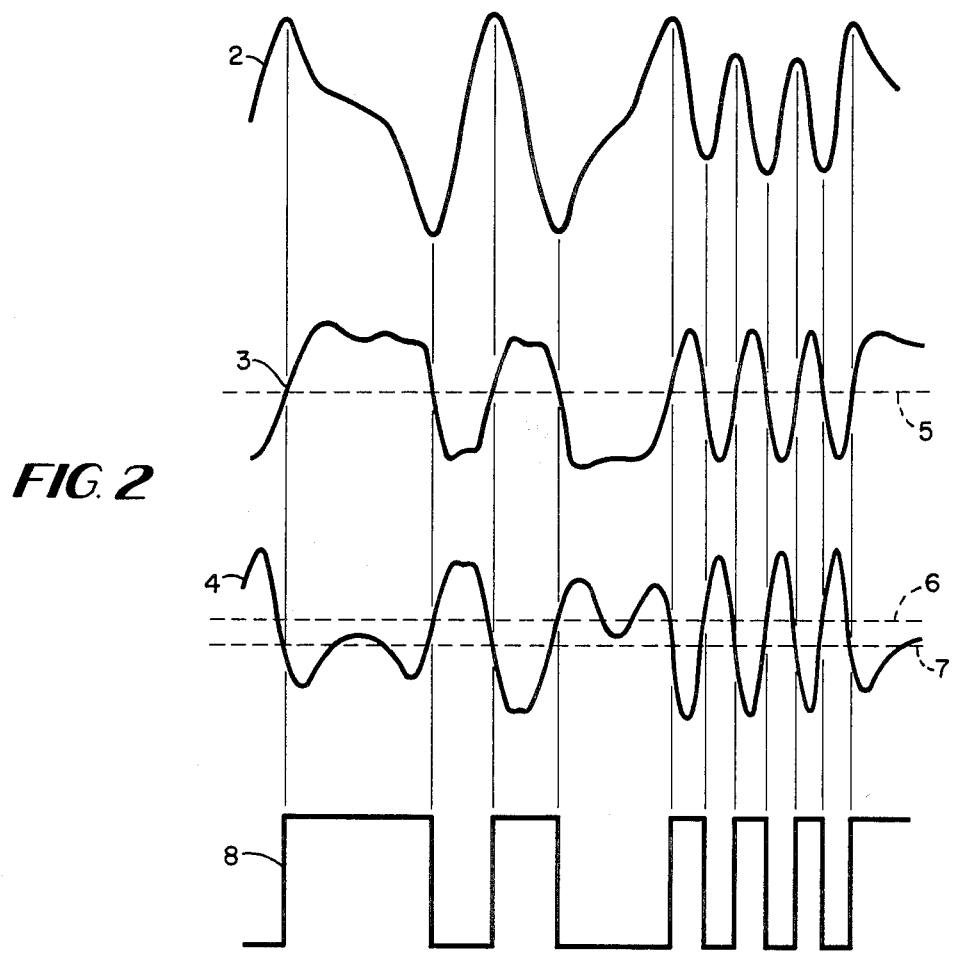
FIG. 2 presents a series of waveforms illustrating conventional processing for the conversion of said read head signal to a replica of the data signal.

Thus, in the operation of the embodiment of FIG. 7, a read head signal such as waveform 2 in FIG. 1, representative of a data signal such as waveform 1 in FIG. 1, is amplified at 32 and coupled to the inverting input of comparator 34. The amplified read head signal is also coupled to the delay means 35 to produce a delayed replica of the amplified read head signal, which is coupled to the non-inverting input of comparator 34. The comparator senses each relative polarity reversal between the two input signals, which, as explained in conjunction with FIG. 6C, is designed to occur in the region of the signal peaks, both positive and negative, by proper selection of the replica delay time and the dynamic bias of the read head signal input to the comparator 34 (waveform C). Each such reversal is presented as a pulse or bit transition at the Q output of the comparator 34. The $\overline{Q}$ output of the comparator is the reversal or inversion of the Q output. These Q and $\overline{Q}$ outputs are coupled to the differential amplifier 43 in that sense which provides an output that is inverted with respect to detected data, and the output of the differential amplifier is coupled to the input of comparator 34 receiving the direct (undelayed) amplified read head signal. The sense and timing of the output of differential amplifier 43 is such as to provide a negative bias to the amplified read head signal at a time just after the positive peaks of that signal and its delayed replica intercept (see 51 and 52 in FIG. 8), and to switch to a positive bias at a time just after the negative peaks intercept, as illustrated in FIG. 6C.

This operation produces at the Q output of comparator 34 a positive transition for each positive pulse intercept of the read head signal and its delayed replica, and a negative transition for each negative pulse intercept, as illustrated by waveform D in FIG. 6C. These transitions constitute an accurate representation of the original data pulse signal that is embodied in a magnetic recording and provides the input for the read head signal (see FIG. 1).

In a second embodiment of the invention, further immunity from noise and transients is afforded by operation of the data detector in a manner synchronous with a clock (strobe) signal derived independently. Means for deriving a properly phased, synchronized clock signal from a detector are known in the art and may include a phase-locked loop and a frequency divider. The strobe signal from the clock generator is made time coherent with read head signal peaks from which it is derived, and then it is applied to gate the data signal detection. Thus, statistically improved immunity to noise and transients, not as critical to the clock loop, is provided for the data loop. Dynamic timing errors are also extracted by synchronous detection. The solid lines of FIG. 9 diagram the synchronous data detector of this embodiment, and circled letters represent the presence of corresponding waveforms from FIGS. 6C, 8 and 10. Since much of the circuit of this embodiment and its basic operation are the same as in the FIG. 7 embodiment, their description will not be repeated in the same detail. The read head signal A and its delayed replica signal B are applied to a clock transition detector 53 which may be of the form previously described and diagramed in FIG. 7, and which is coupled to the clock generator 45. The strobe output of generator 45 controls bilateral switch 54. Switch 54 provides a low impedance connection between shunting resistor 55 and ground when the strobe is high, and isolation from ground when the strobe is low. The junction of series mixing resistors 33A and 33B is connected to shunting resistor 55. All remaining elements of this embodiment are the same as those of the first embodiment (FIG. 7). When switch 54 is "closed", the shunting of resistor 55 to ground attenuates the read head signal input to comparator 34 and, to a lesser extent, the dynamic bias signal input E. When no peak (data transition) is present at the comparator input, the strobe pulse results in only a slight attentuation of the biased signal and produces no effect on the comparator. However, when a peak is present and strobed, the biased signal is sufficiently attentuated with respect to the delayed signal to cause relative polarity reversal and the comparator detects the peak synchronous with that strobe. The values of network resistances are selected to assure strobed detection of peaks reasonably reduced in amplitude by error mechanisms while preventing comparator switching during strobing of off-peak signals.

Figure 10B:
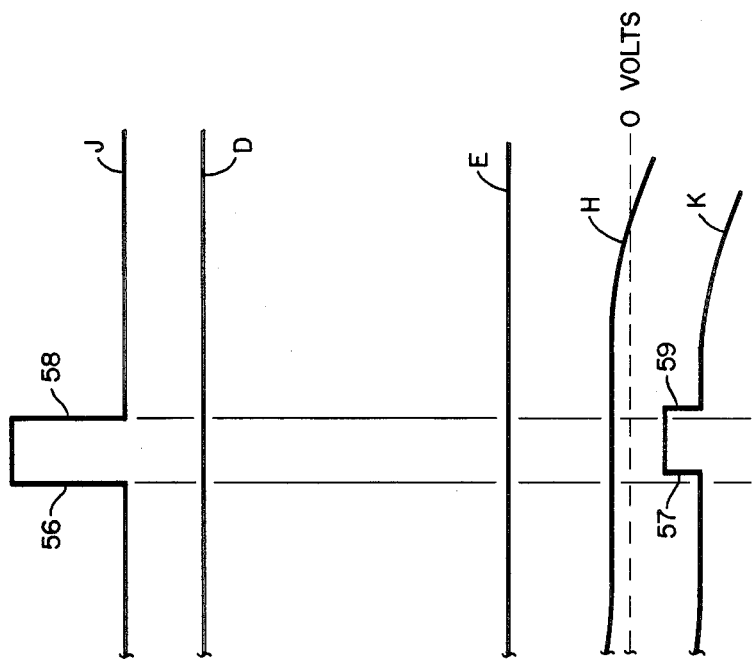
FIG. 10 consisting of 10A and 10B is a waveform diagram of certain signal details applicable to the embodiment of FIG. 9.
Figure 10A:
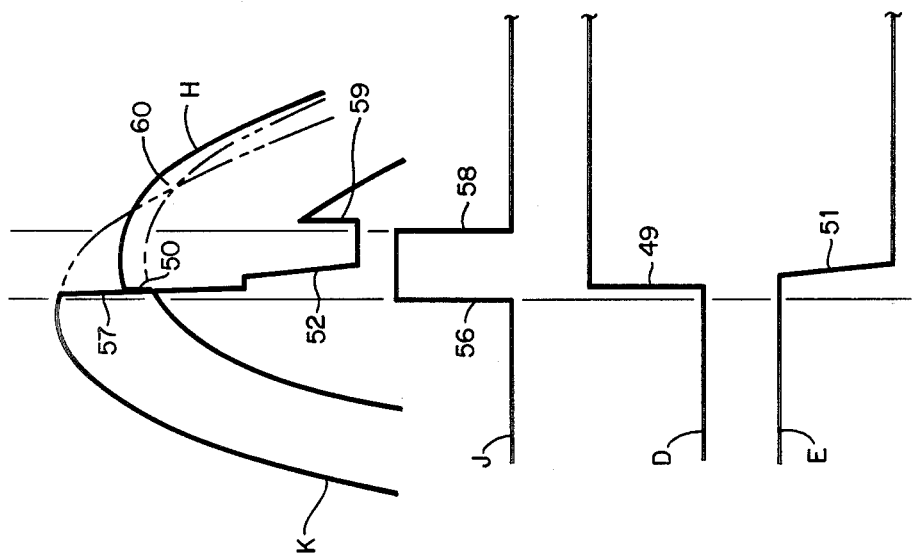

FIG. 10 illustrates timing and waveform details associated with the synchronous detection described in this embodiment. In FIG. 10A, strobe signal J results in attentuation of biased read signal K and a reversal in its polarity with respect to delayed replica signal H. The comparator 34 therefore switches, producing a positive transition 49 in the data signal D and a negative transition 51 in the bias signal E. The strobe leading edge 56 and biased read signal step 57 are coincident within the propagation delay of switch 54; bias transition 51 and biased read signal step 52 are coincident; strobe trailing edge 58 and biased signal recovery step 59 are coincident within the switch propagation delay; and data signal transition 49 and hysteresis step 50 in replica signal H are coincident. Dynamic bias level in this embodiment precludes intercepts prior to strobing, as can be seen by the phantom line intercept 60 of the comparator input waveforms of FIG. 10A. This permits the strobe to correct timing errors in the read head signal. The high bias level of this condition also creates greater noise and transient immunity. If there is no peak on the read head signal at the time of a strobe pulse, no change in the comparator output is experienced. This is explained by the relationship illustrated in FIG. 10B. As there shown, although strobe signal J causes momentary attentuation of baised read head signal K, there is no change in the relative polarity of the comparator inputs H and K; therefore, comparator 34 does not switch.

Figure 9:
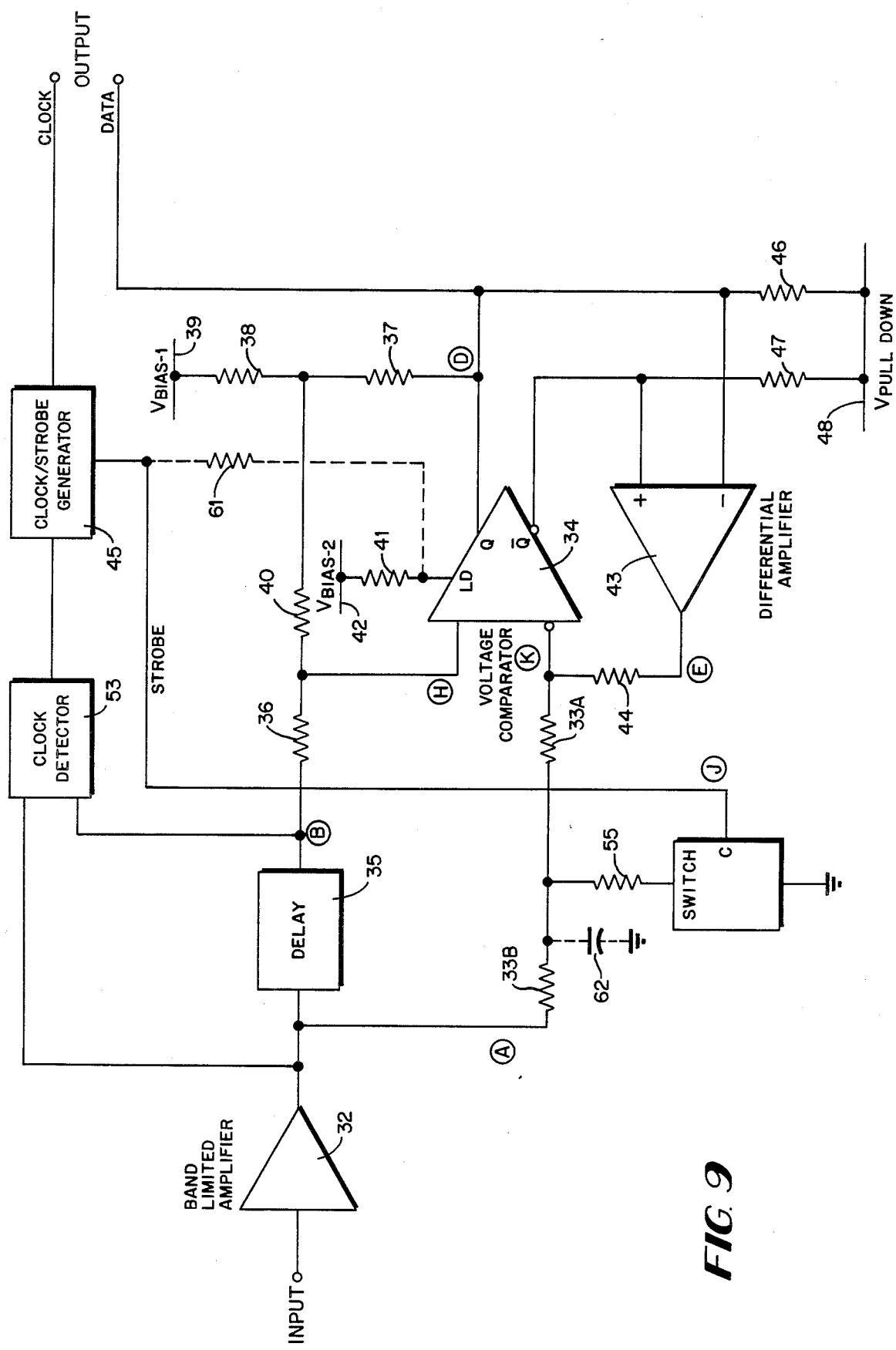
FIG. 9 is a circuit diagram of a second embodiment of the present invention, and including within the diagram an alternate variation of the embodiment.

A third embodiment of the invention is diagramed in FIG. 9 by the addition of the circuitry presented by dashed lines. In this case, the strobe signal previously described as coupled to switch 54, is also coupled to the latch disable (LD) input of comparator 34 by resistor 61. When the latch disable or strobe signal is high, a detected change in the read head signal causes an instantaneous change in the comparator output, as in the previously described embodiments. When the latch disable or strobe signal is low, the last detected data signal level remains latched and no change in the comparator output (data or bias) occurs, regardless of input changes. The advantage of this embodiment is that comparator input transients can produce errors only during strobing, a statistically limited possibility. For normal operation of the comparator hysteresis loop, the strobe signal should set up the latch disable input of the comparator before causing data detection. If the propagation delay of switch 54 is less than the required set up time, then capacitor 62 can be added for additional delay. Obviously, the LD input of comparator 34 could be biased high and a separate latching element (flip-flop) used.

A fourth embodiment of this invention is diagramed in FIG. 7 by addition of the dashed line circuitry and deletion of the solid line circuit connection between the points marked "X". For this embodiment, the strobe is timed to occur after signal peaks, for example one-fourth of a bit cell later, and the strobe acts only on the latch disable (LD) input of the comparator 34. The dynamic bias level selected causes mid-peak detection as in the first described embodiment, but the comparator output changes only during the presence of a strobe pulse. In this embodiment, susceptability to transients is thus statistically limited as in the second and third described embodiments, but fewer parts are used. Dynamic bias action and hysteresis action are delayed as well as the data output, until latch disabling or strobing occurs. Noise immunity during strobing is not as high as in the second and third embodiments.

The invention described herein is generally useful in the detection of digital data from planar flux recordings read by induction heads. The detection means provided is relatively immune to common error mechanisms, and accommodates a wide range of input signal levels. Accurate detection of digital data can be accomplished without the complexity of amplitude equalization, phase equalization, or dc restoration. Although described herein in terms of digital data signals, the invention is also applicable to detection of magnetically recorded PDM data, FM carriers, and similar recordings. Accordingly, it is understood that the foregoing description of the invention is presented as illustrative only, and the specific embodiments present the best mode currently contemplated for practicing the invention. Various changes and modifications will become apparent to those skilled in the art, and such as are embraced by the spirit and scope of the appended claims are contemplated as being within the purview of the present invention.

What is claimed is:

1. A method for reproducing a binary signal from a magnetic recording thereof, comprising transducing the recording to an electrical read signal having peaks corresponding to binary signal transitions, producing a delayed replica of said read signal, dynamically biasing at least one of said read signal and replica in one sense following each positive peak thereof and oppositely following each negative peak thereof, detecting reversals of the relative polarity of said read signal and replica, selecting the value and sense of the dynamic bias and the amount of the read signal replica delay to effect said relative polarity reversals in the regions of said peaks, the polarity switching of the dynamic biasing following said relative polarity reversals, and producing a replica of said binary signal from said relative polarity reversals, the time relationship of said relative polarity reversals corresponding to the time relationship of said binary signal transitions.

2. A method as set forth in claim 1, wherein said relative polarity reversals of one sense produce bit transitions of one sense in said digital signal replica, and said relative polarity reversals of the opposite sense produce bit transitions of the opposite sense in said digital signal replica.

3. A method as set forth in claim 1, wherein signals produced by said detection of reversals of relative polarity are coupled to one of said read signal and replica to provide the dynamic biasing thereof.

4. A method as set forth in claim 3, wherein said relative polarity reversals are caused by a strobe signal acting on said dynamically biased one of said read signal and replica, said strobe signal being derived from the peaks of said read signal.

5. A method as set forth in claim 3, wherein said detecting of relative polarity reversals is limited to periods of a strobe signal derived from the peaks of said read signal.

6. A method as set forth in claim 5, wherein said relative polarity reversals are caused by said strobe signal acting on said dynamically biased one of said read signal and replica.

7. A system for reading a magnetically recorded binary signal and replicating said binary signal, comprising means for transducing the magnetic recording into an electrical read signal having peaks corresponding to recorded binary signal transitions, means for producing a delayed replica of said read signal, means for comparing the relative polarities of said read signal and delayed replica and detecting reversals in said relative polarity to produce a replica of said binary signal, means for dynamically biasing at least one of said read signal and delayed replica thereof providing a bias of one sense following a positive peak thereof and a bias of the opposite sense following a negative peak thereof, the dynamically biasing means including means responsive to said binary signal replica and said reversed polarity signal for generating the dynamic biasing signal and coupling the same to said one of said read signal and delayed replica thereof, the value of the dynamic biasing signal and the amount of delay of said replica being selected to cause said reversals in relative polarity to occur in the region of the peaks of said read signal and replica thereof, said comparing and detecting means producing a transition of one sense in said binary signal replica in response to a said reversal in relative polarities in one direction, and producing a transition of the opposite sense in said binary signal replica in response to a said reversal in relative polarity in the opposite direction.

8. A system as set forth in claim 7, and further including means responsive to the peaks of said read signal for generating a strobe signal, means latching said comparing and detecting means against response to reversals in relative polarity between said read signal and replica thereof, and means coupling said strobe signal to said comparing and detecting means to unlatch the same during the time of application of said strobe signal.

9. A system as set forth in claim 7, and further including means responsive to the peaks of said read signal for generating a strobe signal, and means responsive to said strobe signal for effecting said reversals in relative polarity between said read signal and replica thereof.

10. A system as set forth in claim 9, and further including means latching said comparing and detecting means against response to reversals in relative polarity between said read signal and replica thereof, and means coupling said strobe signal to said comparing and detecting means to unlatch the same during the time of application of said strobe signal.

11. A system as set forth in claim 7, and further including means responsive to the peaks of said read signal for generating a strobe signal, means latching said comparing and detecting means against response to reversals in relative polarity between said read signal and replica thereof, and means responsive to said strobe signal to unlatch said comparing and detecting means during the time of application of said strobe signal.

12. A system as set forth in claim 11, and further including means responsive to said strobe signal for effecting said reversals in relative polarity between said read signal and replica thereof.

13. A system as set forth in claim 7, and further including regenerative feedback means coupling an output of said comparing means to an input thereof, to facilitate said detecting of reversals.

14. A system as sets forth in claim 13, wherein the effect of said dynamically biasing means is delayed relative to the effect of said feedback means.

15. A method for detecting peaks in a waveform, comprising producing a delayed replic of said waveform, dynamically biasing at least one of said waveform and replica in one sense following each positive peak thereof and oppositely following each negative peak thereof, detecting reversals of the relative polarity of said waveform and replica, and selecting the value and sense of the dynamic bias and the amount of the replica delay to effect said relative polarity reversals in the regions of said peaks, the polarity switching of the dynamic biasing following said relative polarity reversals.

16. A method as set forth in claim 15, wherein signals produced by said detection of reversals of relative polarity are coupled to one of said waveform and replica to provide the dynamic biasing thereof.

17. A method as set forth in claim 16, wherein said relative polarity reversals are caused by a strobe signal acting on said dynamically biased one of said waveform and replica, said strobe signal being derived from the peaks of said waveform.

18. A method as set forth in claim 16, wherein said detecting of relative polarity reversals is limited to periods of a strobe signal derived from the peaks of said waveform.

19. A method as set forth in claim 18, wherein said relative polarity reversals are caused by said strobe signal acting on said dynamically biased one of said waveform and replica.

20. A system for detecting peaks in a waveform, comprising means for producing a delayed replica of said waveform, means for comparing the relative polarities of said waveform and delayed replica and detecting reversals in said relative polarity, and means for dynamically biasing at least one of said waveform and delayed replica thereof providing a bias of one sense following a positive peak thereof and a bias of the opposite sense following a negative peak thereof, the dynamically biasing means including means responsive to said comparing and detecting means, for generating a dynamic biasing signal and coupling the same to said one of said waveform and delayed replica thereof, the value of the dynamic biasing signal and the amount of delay of said replica being selected to cause said reversals in relative polarity to occur in the region of the peaks of said waveform and replica thereof.

21. A system as set forth in claim 20, and further including means responsive to the peaks of said waveform for generating a strobe signal, means latching said comparing and detecting means against response to reversals in relative polarity between said waveform and replica thereof, and means coupling said strobe signal to said comparing and detecting means to unlatch the same during the time of application of said strobe signal.

22. A system as set forth in claim 20, and further including means responsive to the peaks of said waveform for generating a strobe signal, and means responsive to said strobe signal for effecting said reversals in relative polarity between said waveform and replica thereof.

23. A system as set forth in claim 22, and further including means latching said comparing and detecting means against response to reversals in relative polarity between said waveform and replica thereof, and means coupling said strobe signal to said comparing and detecting means to unlatch the same during the time of application of said strobe signal.

24. A system as set forth in claim 20, and further including means responsive to the peaks of said waveform for generating a strobe signal, means latching said comparing and detecting means against response to reversals in relative polarity between said waveform and replica thereof, and means responsive to said strobe signal to unlatch said comparing and detecting means during the time of application of said strobe signal.

25. A system as set forth in claim 24, and further including means responsive to said strobe signal for effecting said reversals in relative polarity between said waveform and replica thereof.

26. A system as set forth in claim 20, and further including regenerative feedback means coupling an output of said comparing means to an output thereof, to facilitate said detecting of reversals.

27. A system as sets forth in claim 26, wherein the effect of said dynamically biasing means is delayed relative to the effect of said feedback means.

* * * * *